United States Patent
Pedoeem et al.

(10) Patent No.: US 8,624,133 B2
(45) Date of Patent: Jan. 7, 2014

(54) FILLER PANEL WITH CABLE MANAGEMENT FEATURE

(75) Inventors: Albert Pedoeem, West Orange, NJ (US); Paul V. Shannon, Parsippany, NJ (US); Mahesh Mistry, Parsippany, NJ (US); Larry Fox, Nanuet, NY (US); Roberto Medrano, Wylie, TX (US); Jimmy O. Goodwin, Lucas, TX (US)

(73) Assignee: Fujitsu Limited, Kawasaki-shi (JP)

( * ) Notice: Subject to any disclaimer, the term of this patent is extended or adjusted under 35 U.S.C. 154(b) by 242 days.

(21) Appl. No.: 12/874,713

(22) Filed: Sep. 2, 2010

(65) Prior Publication Data

US 2011/0180314 A1    Jul. 28, 2011

Related U.S. Application Data

(60) Provisional application No. 61/297,378, filed on Jan. 22, 2010.

(51) Int. Cl.
    *H05K 9/00*    (2006.01)
(52) U.S. Cl.
    USPC ............................. 174/382; 361/797; 361/800
(58) Field of Classification Search
    USPC .................. 174/377, 382; 361/800, 816, 797
    See application file for complete search history.

(56) References Cited

U.S. PATENT DOCUMENTS

| | | | | |
|---|---|---|---|---|
| 4,494,520 A * | 1/1985 | Hurwitz | .......................... | 123/633 |
| 4,894,749 A * | 1/1990 | Elko et al. | ..................... | 361/690 |
| 5,943,219 A * | 8/1999 | Bellino et al. | ................ | 361/816 |
| 5,952,616 A * | 9/1999 | Morrow | ......................... | 174/135 |
| 6,166,919 A * | 12/2000 | Nicolici et al. | ................ | 361/800 |
| 6,600,660 B2 * | 7/2003 | Hattori | .......................... | 361/801 |
| 6,637,719 B2 * | 10/2003 | Jiang | ............................. | 248/682 |
| 6,654,256 B2 * | 11/2003 | Gough | .......................... | 361/816 |
| 6,713,672 B1 * | 3/2004 | Stickney | ........................ | 174/382 |
| 6,724,640 B1 * | 4/2004 | Cooper | .......................... | 361/800 |
| 6,738,262 B2 * | 5/2004 | Trioli et al. | .................... | 361/753 |
| 6,822,859 B2 * | 11/2004 | Coglitore et al. | ......... | 361/679.49 |
| 7,491,900 B1 * | 2/2009 | Peets et al. | ..................... | 174/383 |
| 2001/0018979 A1 * | 9/2001 | Dispenza et al. | .............. | 174/350 |
| 2003/0169580 A1 * | 9/2003 | Brooks et al. | ................. | 361/800 |
| 2003/0226676 A1 * | 12/2003 | Barringer et al. | ........... | 174/35 R |
| 2005/0157472 A1 * | 7/2005 | Malone et al. | ................. | 361/724 |
| 2010/0315792 A1 * | 12/2010 | Jones | ............................. | 361/753 |

\* cited by examiner

*Primary Examiner* — Hung Ngo
(74) *Attorney, Agent, or Firm* — Baker Botts L.L.P.

(57) ABSTRACT

A filler panel for an electronics shelf is provided. The electronics shelf includes a number of slots each configured to receive an electronic device. The filler panel includes a non-conductive main body that includes a front wall, a side wall, and a back wall. The front wall and back wall are configured to fill a width of a slot of the electronics shelf and the side wall is configured to extend into a depth of the slot. The filler panel also includes an electromagnetic shielding portion made of a conductive material and coupled to the main body. Furthermore, the main body includes one or more cable clips each configured to retain one or more cables within the main body.

18 Claims, 6 Drawing Sheets

FILLER PANEL WITH CABLE MANAGEMENT FEATURE

RELATED APPLICATION

This application claims the benefit of U.S. provisional application No. 61/297,378 entitled "Filler Panel with Cable Management Feature" filed Jan. 22, 2010, the contents of which is hereby incorporated by reference in its entirety.

TECHNICAL FIELD

The present invention relates generally to filler panels for equipment shelves and, more particularly, to a filler panel having a cable management feature.

BACKGROUND

The infrastructure behind modern electronic systems increasingly requires deployment of multiple communication devices in systems that consolidate the various device components into racks or shelves, which may reduce the storage and operation space required by the owner of the infrastructure as well as easing the effort required for operation or maintenance. The devices stored in these racks or shelves may include communication network components such as amplifiers, switches, network management cards, network interface cards, or other devices. However, in many instances not all available space within the rack is in use at a given point in time.

Filler panels are devices used to fill the unused space in such a rack or shelf. These panels serve many uses, including electromagnetic shielding (to ensure proper operation of the system components) and aesthetic appearance of the rack as a whole. Filler panels are also used to maintain airflow, meet certification requirements (e.g., GR-63-CORE and GR-1089-CORE), and provide EMI/ESD functionality. As more electronic devices are implemented and operated in consolidated racks or shelves, manufacturers and suppliers of such racks face increasing challenges in maintaining performance levels required by end-users while reducing the manufacturing and operating costs.

Traditional filler panels have been made from metal or mostly metal and are often rectangular boxes. Such a design use a lot of material and are costly. Filler panels typically come in three shapes—rectangular box style, cover style, and blade style. The rectangular filler panels are typically of a four-walled construction. The cover style is just a cover that covers an opening of a shelf when a unit is not installed in the opening. The blade style is a combination of a cover and a single walled blade that guides the filler panel into the opening in the shelf. It covers the opening but uses a single walled blade to form the filler panel. Certain filler panels have a crude means to store a limited number of connectors (one or two) outside of the shelf. The connectors are stored in a removable foam pocket that is attached to the outside of the filler panel (outside of the shelf when the filler panel is installed).

SUMMARY

In accordance with a particular embodiment of the present disclosure, a filler panel for an electronics shelf is provided. The electronics shelf includes a number of slots each configured to receive an electronic device. The filler panel includes a non-conductive main body that includes a front wall, a side wall, and a back wall. The front wall and back wall are configured to fill a width of a slot of the electronics shelf and the side wall is configured to extend into a depth of the slot. The filler panel also includes an electromagnetic shielding portion made of a conductive material and coupled to the main body. Furthermore, the main body includes one or more cable clips each configured to retain one or more cables within the main body.

In accordance with a particular embodiment of the present disclosure, a method for installing a filler panel in an electronics shelf is provided. The electronics shelf includes a number of slots each configured to receive an electronic device. The method includes inserting a filler panel in a slot of the electronics shelf. The filler panel includes a non-conductive main body that includes a front wall, a side wall, and a back wall. The front wall and back wall are configured to fill a width of a slot of the electronics shelf and the side wall is configured to extend into a depth of the slot. The filler panel also includes an electromagnetic shielding portion made of a conductive material and coupled to the main body. Furthermore, the main body includes one or more cable clips each configured to retain one or more cables within the main body. The method also includes inserting one or more cables into the main body and securing the one or more cables in the one or more cable clips.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION

Figure 1A:
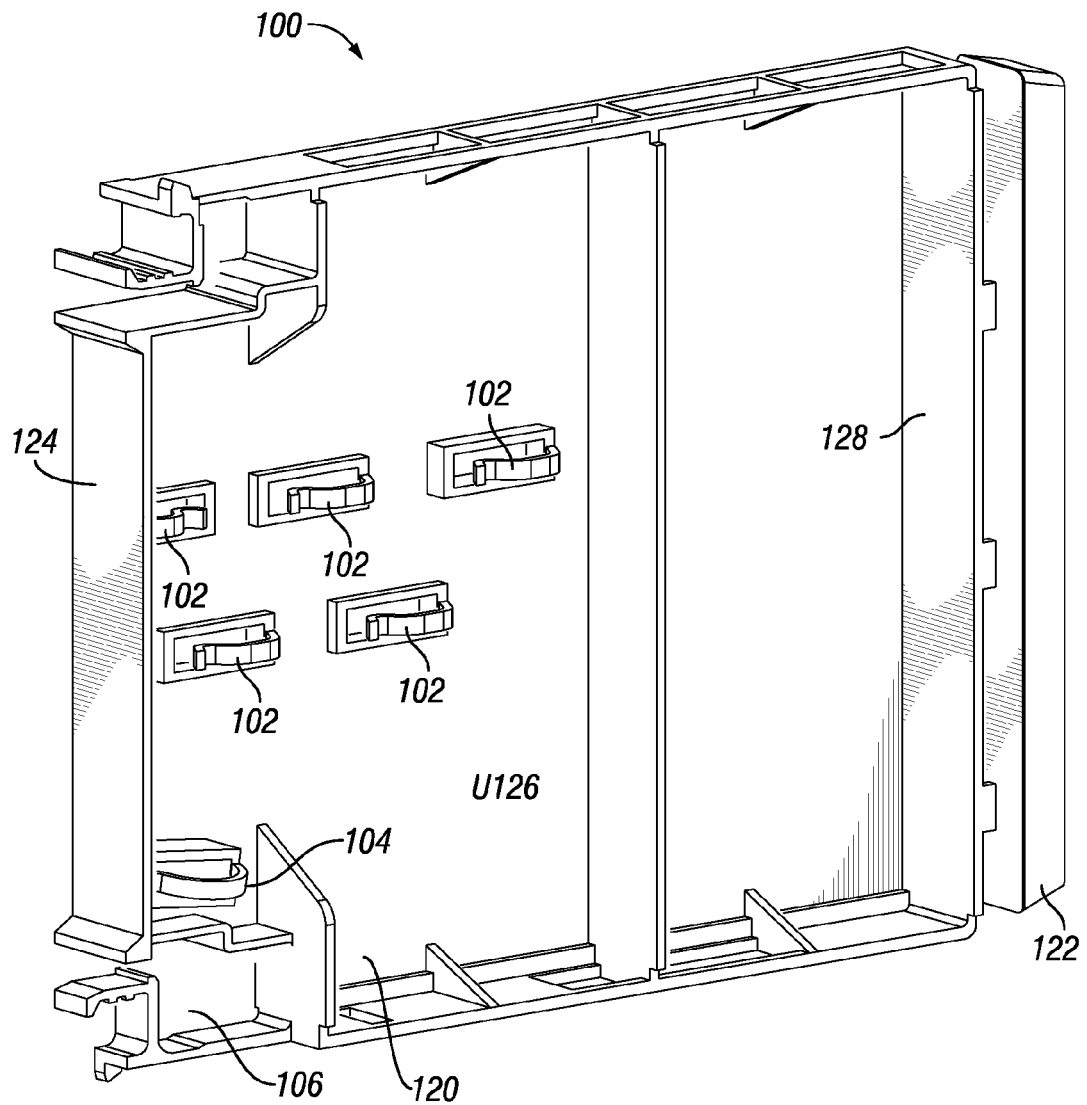
FIGS. 1A and 1B illustrate a filler panel that may be used in a shelf that supports one or more electronic devices, in accordance with one embodiment of the present disclosure.

The present description relates to a new filler panel design for use in electronic device shelves, racks, cabinets and the like (generally referred to herein as "shelves"). Such a filler panel may be used to fill unused portions of the shelf, such as slots or bays, that do not have an associated electronic device installed. For the purposes of this disclosure, an electronic device may include any device or component configured for use in an electronics system, whether optical, mechanical, electrical, or otherwise. For example, an electronic device may be an optical amplifier card, a network storage device, a network interface card, multiplexer, a dispersion compensation module, or other device or component used in an electronics system and configured to be stored, maintained, and/or operated within a storage shelf, rack or cabinet. Such a shelf, rack or cabinet may be of standard size that accepts modular components, or may be custom-built and sized for a particular purpose. An electronic device may also include any electronic device or component configured for storage and/or operation in a shelf, rack or cabinet system, such as a computer server that houses server blades or other circuit boards in a shelf. The figures discussed herein disclose a filler panel for use in a telecommunications node; however, this should not be seen to limit the scope of the present disclosure. For instance, the filler panel disclosed herein may be applicable to many other environments, such as the storage and operation of computer servers, RF/Microwave equipment, or other devices requiring the use of electromagnetic shielding and blockage of open space within a storage shelf, rack or cabinet.

Although the terms "electronics" shelf and "electronic" device are used, it should be understood that in certain embodiments an electronic device (as that term is used herein) may be a passive component that does not actually include any electronics. As an example only, a shelf of an optical communications node may include passive dispersion compensation modules and other modules that do not include electronics. Such modules are included within the scope of the term "electronic device" as used herein.

Due to the close proximity of multiple electronic devices within the shelf, the aggregate electromagnetic fields produced by the electronic devices, which may be significant, may leak from the shelf. Thus, filler panels may be composed of materials that provide for electromagnetic shielding in order to prevent this leakage. There are two primary, related difficulties in creating filler panels with the requisite level of electromagnetic shielding. The most difficult of these is cost. Various known materials may provide acceptable levels of electromagnetic shielding. For instance, metals and conductive polymers, such as plastics impregnated with conductive fibers (e.g., steel), may be used for filler panels. While conductive polymers offer a less expensive alternative to using metallic or other conductive materials for manufacture of filler panels, these materials remain expensive. Additionally, the material properties of this relatively new class of materials remains poorly understood in comparison to traditional conductive materials (e.g., metals) or traditional, nonconductive plastics.

The second, related difficulty is aesthetics. The presence of the conductive material within a conductive polymer may make it difficult or impossible to provide a customized or matchable color or design to a specific end-user. The properties of traditional metallic conductors, whether used alone or as a fiber within the conductive polymer, increase the variability of coloring the filler panel. As a result, the aesthetic appeal of filler panels from different batches, or obtained at different times, may be undesirable in the eyes of the end-user. A solution to both difficulties is to manufacture only a portion of filler panel from a conductive material (when necessary for electromagnetic shielding), while using less expensive materials that may be more readily customizable for the remainder.

Furthermore, another problem that exists with the use of shelves and existing filler panels is that such filler panels do not provide an adequate way to deal with the cabling or wiring that may be associated with the empty shelf areas that the filler panels are occupying. For example, an optical communication shelf may have optical cables pre-positioned at the shelf such that any new optical cards added to the shelf can be quickly and easily installed in the shelf and connected to the appropriate optical cables. Embodiments of the present disclosure also provide a cable management feature that enables the user to easily store such pre-positioned cables inside the shelf and filler panel to protect the cables from damage.

Figure 1B:
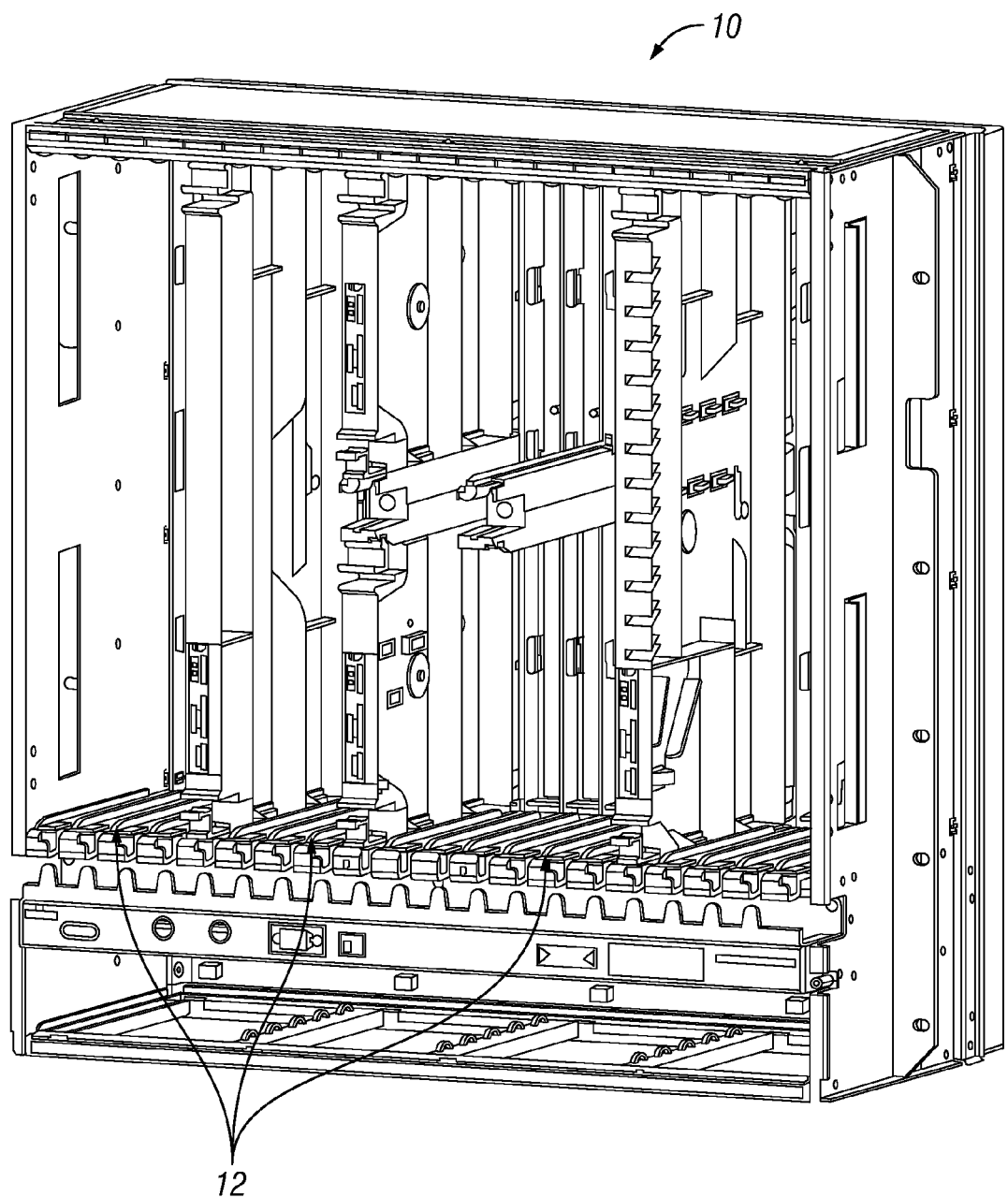

FIGS. 1A and 1B illustrate a filler panel 100 that may be used in a shelf 10 that supports one or more electronic devices, such as communication equipment. In some embodiments, the shelf 10 may be used in optical networking equipment, such as in the Fujitsu Flashwave 9500 series platform. As mentioned above, filler panel(s) 100 may be used when all of the slots, bays or the other openings (generally referred to herein as "slots" 12 within the shelf 10 are not currently taken by electronic devices, such as optical line cards, amplifier cards, controller cards, and the like. For instance, the manufacturer of the shelf may provide expansion slots within the shelf 10 so that the end-user may later expand its use of the shelf 10 without needing to purchase an additional shelf. Filler panel 100 is an innovative modular design that uses color-matched non-conductive plastic and a small portion of conductive material (when necessary) that can be used to meet thermal and FCC emissions requirements while providing flexible cable/wire/fiber management for a wide range of cable/wire/fiber types.

Filler panel 100 includes a main body 120 that is made of a non-conductive plastic and a electromagnetic shielding portion 122 that is used to provide electromagnetic shielding. The main body 120 is formed to generally fill the area of the electronics shelf in which it is inserted and may be made of any suitable type of plastic or other suitable material. For example, in one embodiment, main body 120 is made of a blend of polystyrene and acrylonitrile-butadiene-styrene (ABS). In another embodiment, main body 120 may made of Cycoloy. In particular embodiments, main body 120 is UL94-V0 fire rated. Main body 120 may be formed by injection molding or any other suitable process. Main body 120 has a front wall 124, a side wall 126, and a back wall 128. The front wall 124 and back wall 128 may have a width that is similar to the width of the slot in which the filler panel 100 is to be inserted. The side wall 126 may have a depth that is similar the depth of the slot in which the filler panel 100 is to be inserted (minus the depth of electromagnetic shielding portion 122). The lack of a second side wall may provide for access to clips 102 and 104 for cable storage.

Electromagnetic shielding portion 122 may be a conductive plastic (such as a polycarbonate/ABS base with embedded nickel-coated carbon fiber, as one example), but could also be any other type of conductive material, such as metal. Electromagnetic shielding portion 122 may be formed by injection molding or any other suitable process. Electromagnetic shielding portion 122 may be configured in certain embodiments to interface with or generally conform to an electronic interface intended to be coupled with an electronic device, such as an electronics card, inserted into the slot of the shelf. In the illustrated embodiment, the electromagnetic shielding is needed at the back of the shelf and thus electromagnetic shielding portion 122 is positioned at the back end of the card (the end that is inserted first into the shelf) and coupled to back wall 128. However, the electromagnetic shielding portion 122 could also be located at the front end of the card and reconfigured accordingly.

As discussed above, filler panel 100 also has a cable management feature that is implemented in the illustrated embodiment through the use of several retaining clips 102 and 104. Clips 102 and 104 may be formed as part of the main body 120 and are configured to hold cables, wire, fibers or the like (hereinafter generally referred to as "cables"). Each clip 102 is designed to hold the end of one or more cables (such as connectors located on the end of the cables) and clip 104 is designed to hold several cables that are routed through an opening 106 in the filler panel.

Figure 2:
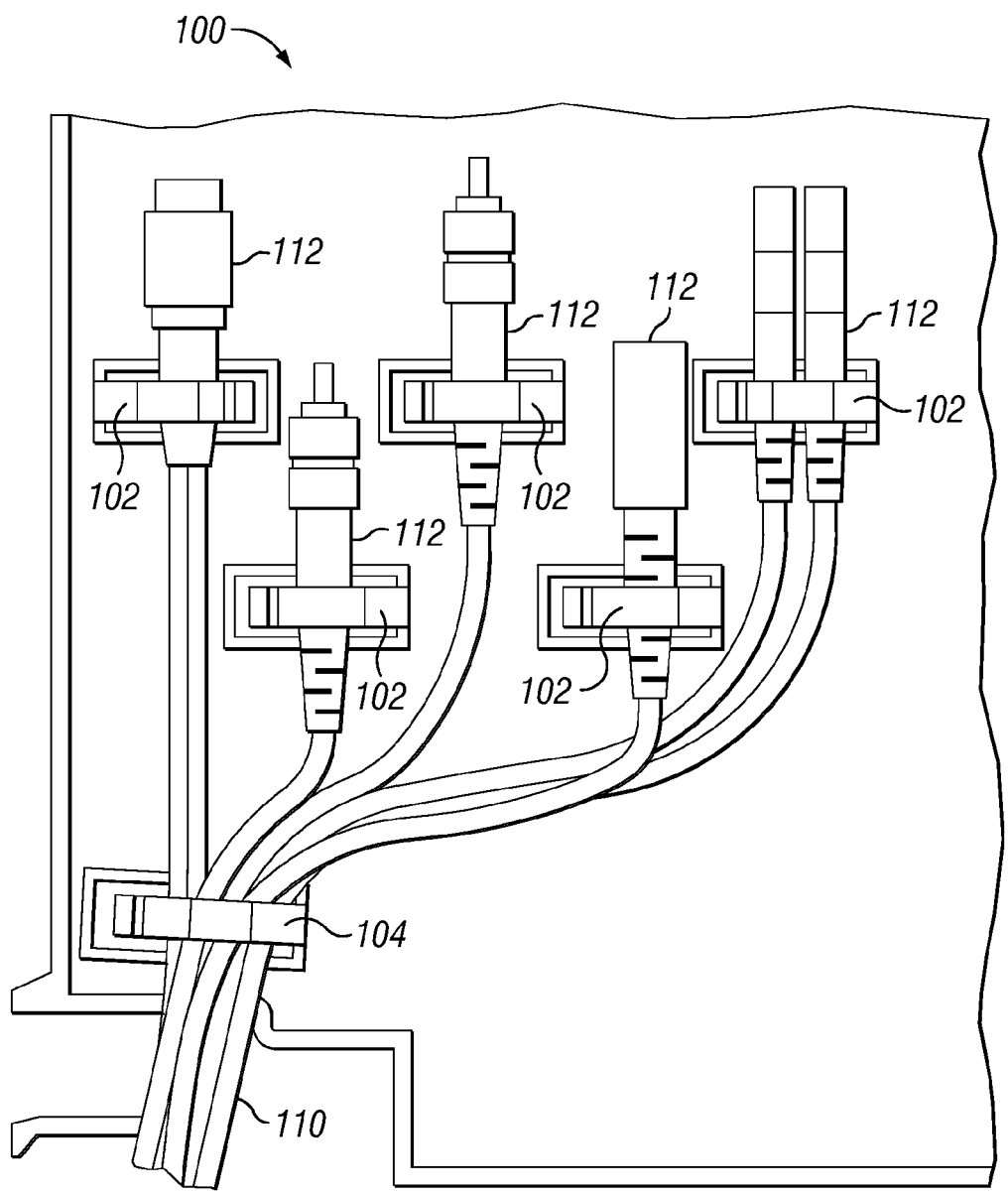
FIG. 2 illustrates the use of clips of the filler panel of FIG. 1 to hold several different types of cables and their associated connectors, in accordance with one embodiment of the present disclosure.

FIG. 2 illustrates the use of clips 102 and 104 to hold several different types of cables 110 and their associated connectors 112. Clips 102 may support any suitable type and size of connectors 112 and clip 104 may be configured to hold any suitable number and size of cables 110. Clips 102 and 104 are shaped such that a part of a connector 112 or a cable 110 may be inserted into the clip and retained. For example, clips 102 and 104 may comprise a generally "C" shaped arm that is somewhat flexible (due to the nature of the plastic used to form clips 102 and 104). The arm may be flexed to insert a connector 112 or a cable 110 under the arm and may then return to it original position to retain the connector 112 or cable(s) 110. Any other suitable clip configurations may alternatively be used. Clips may be formed integrally with side wall 126 (for example, molded as part of side wall 126) or may be separately formed and coupled for side wall 126.

Figure 3:
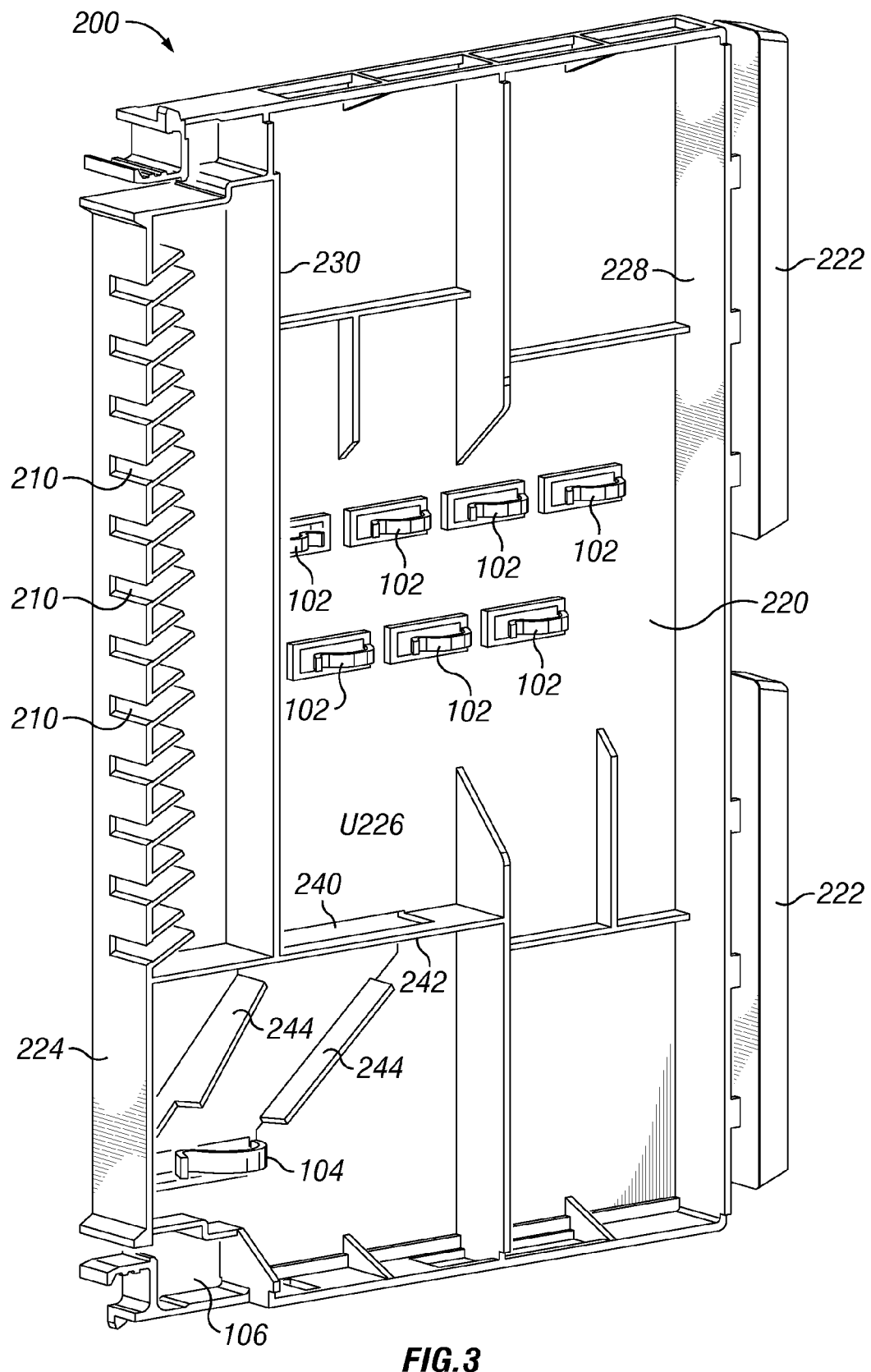
FIG. 3 illustrates another filler panel that may be used in a shelf that supports one or more electronic devices, in accordance with one embodiment of the present disclosure.
Figure 4:
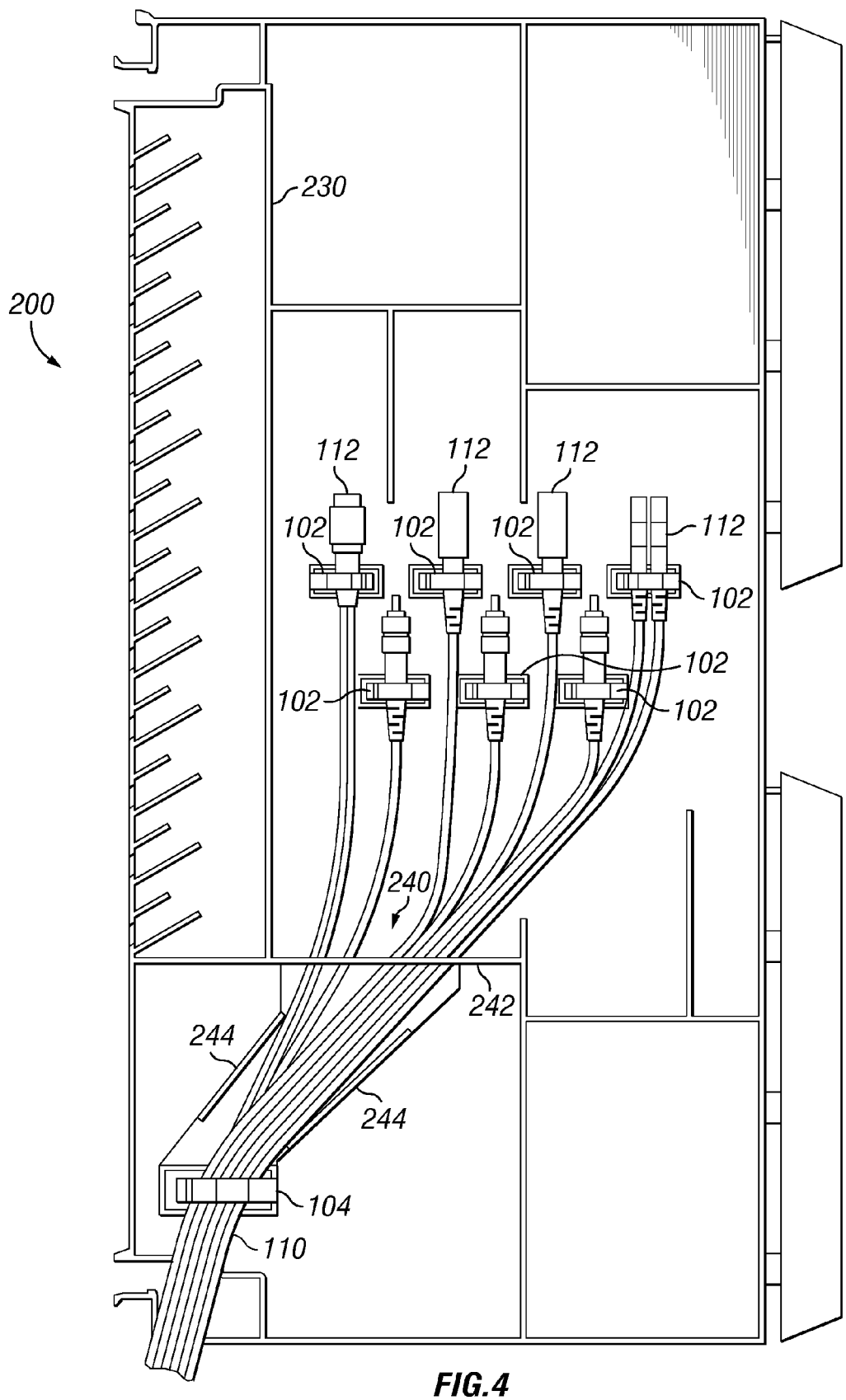
FIG. 4 illustrates the use of clips of the filler panel of FIG. 3 to hold several different types of cables and their associated connectors, in accordance with one embodiment of the present disclosure.

FIGS. 3 and 4 illustrate similar features of a filler panel 200 configured for a larger expansion bay in a shelf. Like filler panel 100, filler panel 200 may have a main body 220 and electromagnetic shielding portions 222 (two or more electromagnetic shielding portions 222 may be present to accommodate the larger bay size and/or the existence of multiple card slots in the bay). Main body 220 may be fabricated from the same materials as main body 120 and electromagnetic shielding portions 222 may be fabricated from the same materials as electromagnetic shielding portion 122. Main body 220 may have a front wall 224, a side wall 226, and a back wall 228. The front wall 224 and back walls 228 may have a width that is similar to the width of the slot in which the filler panel 200 is to be inserted. The side wall 226 may have a depth that is similar the depth of the slot in which the filler panel 200 is to be inserted (minus the depth of electromagnetic shielding portion 222). The lack of a second side wall may provide for access to clips 102 and 104 for cable storage. As with filler panel 100, filler panel 200 has clips 102 and 104 for cable management. Filler panel 200 may also include a cable retention slot 240 which is a hole formed in a support rib 242 of the panel 200. Cables may be feed through slot 240 before being secured in clips 102. Retention slot 240 aids the user when seating or unseating a filler panel into a electronic/passive shelf by keeping cables out of the way (keeps fibers from drooping and getting entangled with adjacent material). Filler panel 200 may also include cable guides 244 which guides the cables between clip 104 and retention slot 240.

Filler panel 200 also includes a number of slots 210 which can accommodate the storage of cables inside the front wall of panel 200. The cables may be easily inserted into slots 210 while the filler panel 200 is installed enabling easier storage of and access to the cables.

Figure 5:
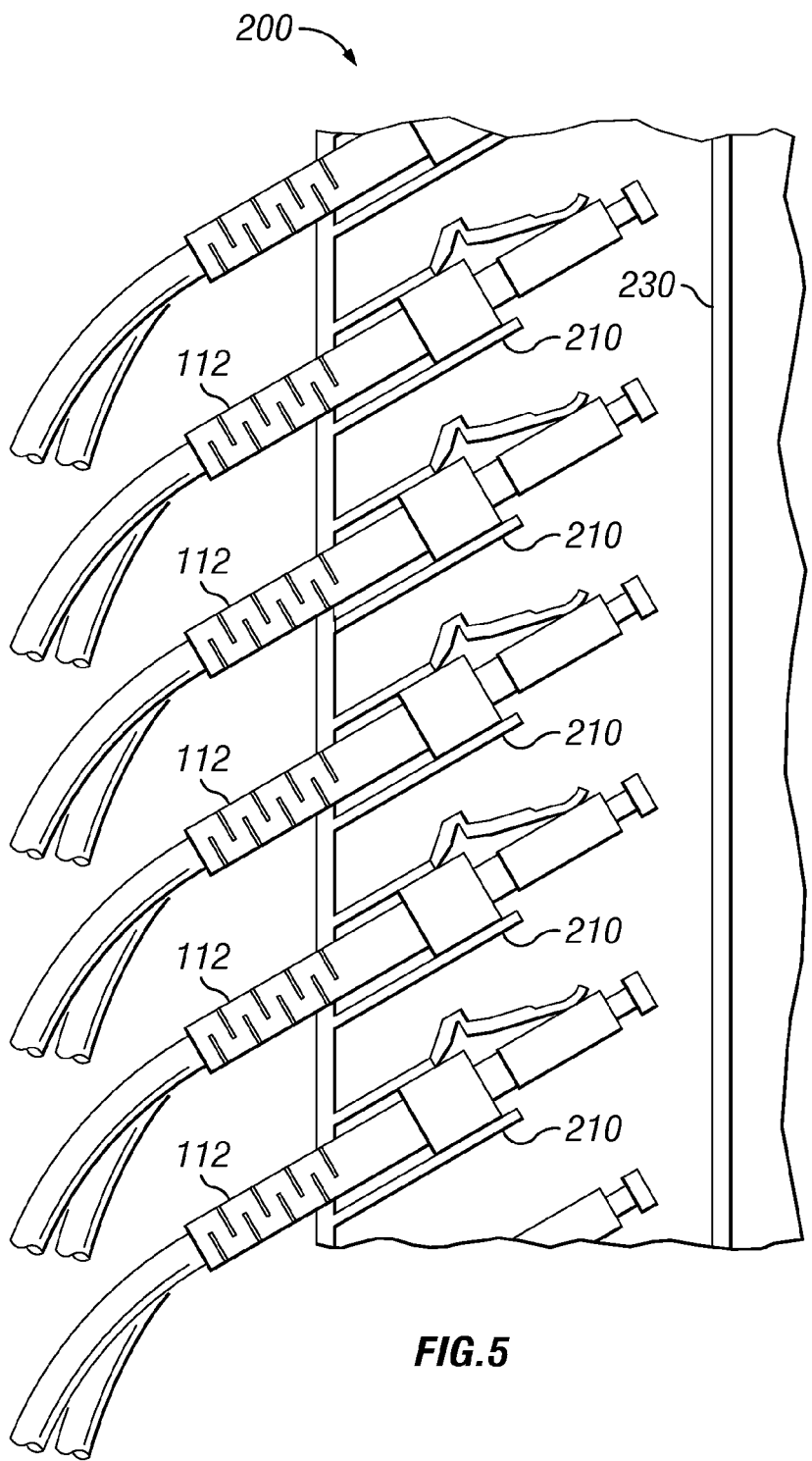
FIG. 5 illustrates the use of slots of the filler panel of FIG. 3 to stow a number of cables, in accordance with one embodiment of the present disclosure.

FIG. 5 illustrates the use of such slots 210 to stow a number of cables. As illustrated, each slot 210 is configured (e.g., through molding as part of main body 220) to hold the connector 112 of a cable such that the cable is held in place. While clips 102 serve to hold cables out of the way and may be used for storage of cables that will be needed if a electronic device is inserted at some point in the slot of the card shelf occupied by filler panel 200, slots 210 allow for storage of cables for easier access and without the need to remove the filler panel. For example, slots 210 may be used to hold optical fiber connectors (for example, Dual LC or 2× Single LC fiber connectors). The connectors may slide in from the side of slots 210 such that the cable boot exits the front openings. Slots 210 may alternatively be configured to accept other connectors. Slots 210 may have an associated partition 230 (see also FIG. 4) to prevent airflow into the main body 220. Partition 230 maintains airflow through main body and prevents air from escaping through slots 210.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure.

What is claimed:

1. A filler panel for an electronics shelf, the electronics shelf comprising a plurality of slots each configured to receive an electronic device, the filler panel configured to be inserted in a slot in place of an electronic device and comprising:
   a non-conductive main body, the main body comprising a front wall, a side wall, and a back wall, the front wall and back wall configured to fill a width of a slot of the electronics shelf and the side wall configured to extend into a depth of the slot when the slot does not contain an electronic device; and
   an electromagnetic shielding portion comprising a conductive material and coupled to the main body;
   the main body further comprising one or more cable clips each configured to retain one or more cables within the main body, wherein the one or more of the clips are configured to retain a connector coupled to an end of each the one or more cables, the connector configured to be connected to the electronic device that the slot is configured to receive.

2. The filler panel of claim 1, wherein the main body comprises a non-conductive plastic.

3. The filler panel of claim 1, wherein the conductive material comprises a conductive plastic.

4. The filler panel of claim 1, wherein the conductive material comprises a metal.

5. The filler panel of claim 1, wherein the electromagnetic shielding portion is coupled to the back wall of the main body.

6. The filler panel of claim 1, wherein one or more of the clips comprise an integral portion of the side wall.

7. The filler panel of claim 1, wherein one or more of the clips are coupled to the side wall.

8. The filler panel of claim 1, wherein:
   the main body further defines an opening configured such that the one or more cables may pass through the opening into the main body; and
   one of the cable clips is positioned proximate to the opening and configured to retain the one or more cables passing through the opening.

9. The filler panel of claim 1, wherein the front wall comprises one or more slots each configured to retain a connector coupled to an end a cable.

10. A method for installing a filler panel in an electronics shelf, the electronics shelf comprising a plurality of slots each configured to receive an electronic device, the method comprising:
    inserting a filler panel in a slot of the electronics shelf that does not contain an electronic device, the filler panel configured to be inserted in the slot in place of the electronic device and comprising:
       a non-conductive main body, the main body comprising a front wall, a side wall, and a back wall, the front wall and back wall configured to fill a width of a slot of the electronics shelf and the side wall configured to extend into a depth of the slot; and
       an electromagnetic shielding portion comprising a conductive material and coupled to the main body;
       the main body further comprising one or more cable clips each configured to retain one or more cables within the main body, wherein the one or more of the clips are configured to retain a connector coupled to an end of each the one or more cables, the connector configured to be connected to the electronic device that the slot is configured to receive; and inserting one or more cables into the main body and securing the one or more cables in the one or more cable clips.

11. The method of claim 10, wherein the main body comprises a non-conductive plastic.

12. The method of claim 10, wherein the conductive material comprises a conductive plastic.

13. The method of claim 10, wherein the conductive material comprises a metal.

14. The method of claim 10, wherein the electromagnetic shielding portion is coupled to the back wall of the main body.

15. The method of claim 10, wherein one or more of the clips comprise an integral portion of the side wall.

16. The method of claim 10, wherein one or more of the clips are coupled to the side wall.

17. The method of claim 10, wherein:

the main body further defines an opening configured such that the one or more cables may pass through the opening into the main body;

one of the cable clips is positioned proximate to the opening and configured to retain the one or more cables passing through the opening; and inserting one or more cables into the main body and securing the one or more cables in the one or more cable clips comprises inserting the one or more cables through the opening and securing the one or more cables in the cable clip positioned proximate to the opening.

18. The method of claim 10, wherein the front wall comprises one or more slots each configured to retain a connector coupled to an end a cable, the method further comprising inserting a connector in one or more of the slots.

* * * * *